US007001799B1

(12) United States Patent
Edwards et al.

(10) Patent No.: US 7,001,799 B1
(45) Date of Patent: Feb. 21, 2006

(54) METHOD OF MAKING A LEADFRAME FOR SEMICONDUCTOR DEVICES

(75) Inventors: Keith M. Edwards, Chandler, AZ (US); Blake A. Gillett, Gilbert, AZ (US)

(73) Assignee: Amkor Technology, Inc., Chandler, AZ (US)

( * ) Notice: Subject to any disclaimer, the term of this patent is extended or adjusted under 35 U.S.C. 154(b) by 0 days.

(21) Appl. No.: 11/009,262

(22) Filed: Dec. 9, 2004

Related U.S. Application Data

(60) Division of application No. 10/781,220, filed on Feb. 18, 2004, now Pat. No. 6,844,615, which is a continuation of application No. 10/387,801, filed on Mar. 13, 2003, now Pat. No. 6,794,740.

(51) Int. Cl.
     *H01L 21/48* (2006.01)
(52) U.S. Cl. ...................................... 438/124
(58) Field of Classification Search ................ 438/106, 438/111, 112, 121, 123, 124, 127
     See application file for complete search history.

(56) References Cited

U.S. PATENT DOCUMENTS

| | | | |
|---|---|---|---|
| 2,596,993 A | 5/1952 | Gookin | |
| 3,435,815 A | 4/1969 | Forcier | |
| 3,734,660 A | 5/1973 | Davies et al. | |
| 3,838,984 A | 10/1974 | Crane et al. | |
| 4,054,238 A | 10/1977 | Lloyd et al. | |
| 4,189,342 A | 2/1980 | Kock | |
| 4,258,381 A | 3/1981 | Inaba | |
| 4,289,922 A | 9/1981 | Devlin | |
| 4,301,464 A | 11/1981 | Otsuki et al. | |
| 4,332,537 A | 6/1982 | Slepcevic | |
| 4,417,266 A | 11/1983 | Grabbe | |
| 4,451,224 A | 5/1984 | Harding | |
| 4,530,152 A | 7/1985 | Roche et al. | |
| 4,541,003 A | 9/1985 | Otsuka et al. | |
| 4,646,710 A | 3/1987 | Schmid et al. | |
| 4,707,724 A | 11/1987 | Suzuki et al. | |
| 4,727,633 A | 3/1988 | Herrick | |
| 4,737,839 A | 4/1988 | Burt | |
| 4,756,080 A | 7/1988 | Thorp, Jr. et al. | |

(Continued)

FOREIGN PATENT DOCUMENTS

DE   19734794 A1   8/1997

(Continued)

OTHER PUBLICATIONS

National Semiconductor Corporation, "Leadless Leadframe Package," Informational Pamphlet from webpage, 21 pages, Oct. 2002, www.national.com.

(Continued)

*Primary Examiner*—Scott Geyer
(74) *Attorney, Agent, or Firm*—Stetina Brunda Garred & Brucker

(57) ABSTRACT

A semiconductor package comprising a leadframe which includes a die paddle having an opening formed therein. In addition to the die paddle, the leadframe includes a plurality of leads, at least one of which is disposed in spaced relation to the die paddle. The remaining leads are attached to the die paddle and extend therefrom. Electrically connected to the die paddle is the source terminal of a semiconductor die which also includes a gate terminal and a drain terminal. The gate terminal is itself electrically connected to the at least one of the leads disposed in spaced relation to the die paddle. A package body at least partially encapsulates the die paddle, the leads, and the semiconductor die such that portions of the leads and the drain terminal of the semiconductor die are exposed in the package body.

22 Claims, 7 Drawing Sheets

U.S. PATENT DOCUMENTS

| | | |
|---|---|---|
| 4,812,896 A | 3/1989 | Rothgery et al. |
| 4,862,245 A | 8/1989 | Pashby et al. |
| 4,862,246 A | 8/1989 | Masuda et al. |
| 4,907,067 A | 3/1990 | Derryberry |
| 4,920,074 A | 4/1990 | Shimizu et al. |
| 4,935,803 A | 6/1990 | Kalfus et al. |
| 4,942,454 A | 7/1990 | Mori et al. |
| 4,987,475 A | 1/1991 | Schlesinger et al. |
| 5,018,003 A | 5/1991 | Yasunaga |
| 5,029,386 A | 7/1991 | Chao et al. |
| 5,041,902 A | 8/1991 | McShane |
| 5,057,900 A | 10/1991 | Yamazaki |
| 5,059,379 A | 10/1991 | Tsutsumi et al. |
| 5,065,223 A | 11/1991 | Matsuki et al. |
| 5,070,039 A | 12/1991 | Johnson et al. |
| 5,087,961 A | 2/1992 | Long et al. |
| 5,091,341 A | 2/1992 | Asada et al. |
| 5,096,852 A | 3/1992 | Hobson |
| 5,118,298 A | 6/1992 | Murphy |
| 5,122,860 A | 6/1992 | Kichuchi et al. |
| 5,134,773 A | 8/1992 | LeMaire et al. |
| 5,151,039 A | 9/1992 | Murphy |
| 5,157,475 A | 10/1992 | Yamaguchi |
| 5,157,480 A | 10/1992 | McShane et al. |
| 5,168,368 A | 12/1992 | Gow, 3rd et al. |
| 5,172,213 A | 12/1992 | Zimmerman |
| 5,172,214 A | 12/1992 | Casto |
| 5,175,060 A | 12/1992 | Enomoto et al. |
| 5,200,362 A | 4/1993 | Lin et al. |
| 5,200,809 A | 4/1993 | Kwon |
| 5,214,845 A | 6/1993 | King et al. |
| 5,216,278 A | 6/1993 | Lin et al. |
| 5,218,231 A | 6/1993 | Kudo |
| 5,221,642 A | 6/1993 | Burns |
| 5,250,841 A | 10/1993 | Sloan et al. |
| 5,252,853 A | 10/1993 | Michii |
| 5,258,094 A | 11/1993 | Furui et al. |
| 5,266,834 A | 11/1993 | Nishi et al. |
| 5,273,938 A | 12/1993 | Lin et al. |
| 5,277,972 A | 1/1994 | Sakumoto et al. |
| 5,278,446 A | 1/1994 | Nagaraj et al. |
| 5,279,029 A | 1/1994 | Burns |
| 5,281,849 A | 1/1994 | Singh Deo et al. |
| 5,294,897 A | 3/1994 | Notani et al. |
| 5,327,008 A | 7/1994 | Djennas et al. |
| 5,332,864 A | 7/1994 | Liang et al. |
| 5,335,771 A | 8/1994 | Murphy |
| 5,336,931 A | 8/1994 | Juskey et al. |
| 5,343,076 A | 8/1994 | Katayama et al. |
| 5,358,905 A | 10/1994 | Chiu |
| 5,365,106 A | 11/1994 | Watanabe |
| 5,381,042 A | 1/1995 | Lerner et al. |
| 5,391,439 A | 2/1995 | Tomita et al. |
| 5,406,124 A | 4/1995 | Morita et al. |
| 5,410,180 A | 4/1995 | Fujii et al. |
| 5,414,299 A | 5/1995 | Wang et al. |
| 5,417,905 A | 5/1995 | LeMaire et al. |
| 5,424,576 A | 6/1995 | Djennas et al. |
| 5,428,248 A | 6/1995 | Cha |
| 5,435,057 A | 7/1995 | Bindra et al. |
| 5,444,301 A | 8/1995 | Song et al. |
| 5,452,511 A | 9/1995 | Chang |
| 5,454,905 A | 10/1995 | Fogelson |
| 5,474,958 A | 12/1995 | Djennas et al. |
| 5,484,274 A | 1/1996 | Neu |
| 5,493,151 A | 2/1996 | Asada et al. |
| 5,508,556 A | 4/1996 | Lin |
| 5,517,056 A | 5/1996 | Bigler et al. |
| 5,521,429 A | 5/1996 | Aono et al. |
| 5,528,076 A | 6/1996 | Pavio |
| 5,534,467 A | 7/1996 | Rostoker |
| 5,539,251 A | 7/1996 | Iverson et al. |
| 5,543,657 A | 8/1996 | Diffenderfer et al. |
| 5,544,412 A | 8/1996 | Romero et al. |
| 5,545,923 A | 8/1996 | Barber |
| 5,581,122 A | 12/1996 | Chao et al. |
| 5,592,019 A | 1/1997 | Ueda et al. |
| 5,592,025 A | 1/1997 | Clark et al. |
| 5,594,274 A | 1/1997 | Suetaki |
| 5,595,934 A | 1/1997 | Kim |
| 5,604,376 A | 2/1997 | Hamburgen et al. |
| 5,608,265 A | 3/1997 | Kitano et al. |
| 5,608,267 A | 3/1997 | Mahulikar et al. |
| 5,625,222 A | 4/1997 | Yoneda et al. |
| 5,633,528 A | 5/1997 | Abbott et al. |
| 5,639,990 A | 6/1997 | Nishihara et al. |
| 5,640,047 A | 6/1997 | Nakashima |
| 5,641,997 A | 6/1997 | Ohta et al. |
| 5,643,433 A | 7/1997 | Fukase et al. |
| 5,644,169 A | 7/1997 | Chun |
| 5,646,831 A | 7/1997 | Manteghi |
| 5,650,663 A | 7/1997 | Parthasaranthi |
| 5,661,088 A | 8/1997 | Tessier et al. |
| 5,665,996 A | 9/1997 | Williams et al. |
| 5,673,479 A | 10/1997 | Hawthorne |
| 5,683,806 A | 11/1997 | Sakumoto et al. |
| 5,689,135 A | 11/1997 | Ball |
| 5,696,666 A | 12/1997 | Miles et al. |
| 5,701,034 A | 12/1997 | Marrs |
| 5,703,407 A | 12/1997 | Hori |
| 5,710,064 A | 1/1998 | Song et al. |
| 5,723,899 A | 3/1998 | Shin |
| 5,724,233 A | 3/1998 | Honda et al. |
| 5,726,493 A | 3/1998 | Yamashita |
| 5,736,432 A | 4/1998 | Mackessy |
| 5,745,984 A | 5/1998 | Cole, Jr. et al. |
| 5,753,532 A | 5/1998 | Sim |
| 5,753,977 A | 5/1998 | Kusaka et al. |
| 5,766,972 A | 6/1998 | Takahashi et al. |
| 5,770,888 A | 6/1998 | Song et al. |
| 5,776,798 A | 7/1998 | Quan et al. |
| 5,783,861 A | 7/1998 | Son |
| 5,801,440 A | 9/1998 | Chu et al. |
| 5,814,877 A | 9/1998 | Diffenderfer et al. |
| 5,814,881 A | 9/1998 | Alagaratnam et al. |
| 5,814,883 A | 9/1998 | Sawai et al. |
| 5,814,884 A | 9/1998 | Davis et al. |
| 5,817,540 A | 10/1998 | Wark |
| 5,818,105 A | 10/1998 | Kouda |
| 5,821,457 A | 10/1998 | Mosley et al. |
| 5,821,615 A | 10/1998 | Lee |
| 5,834,830 A | 11/1998 | Cho |
| 5,835,988 A | 11/1998 | Ishii |
| 5,844,306 A | 12/1998 | Fujita et al. |
| 5,856,911 A | 1/1999 | Riley |
| 5,859,471 A | 1/1999 | Kuraishi et al. |
| 5,866,939 A | 2/1999 | Shin et al. |
| 5,871,782 A | 2/1999 | Choi |
| 5,874,784 A | 2/1999 | Aoki et al. |
| 5,877,043 A | 3/1999 | Alcoe et al. |
| 5,886,397 A | 3/1999 | Ewer |
| 5,886,398 A | 3/1999 | Low et al. |
| 5,894,108 A | 4/1999 | Mostafazadeh et al. |
| 5,897,339 A | 4/1999 | Song et al. |
| 5,900,676 A | 5/1999 | Kweon et al. |
| 5,903,049 A | 5/1999 | Mori |
| 5,903,050 A | 5/1999 | Thurairajaratnam et al. |
| 5,909,053 A | 6/1999 | Fukase et al. |
| 5,915,998 A | 6/1999 | Stidham et al. |
| 5,917,242 A | 6/1999 | Ball |
| 5,939,779 A | 8/1999 | Kim |
| 5,942,794 A | 8/1999 | Okumura et al. |
| 5,951,305 A | 9/1999 | Haba |
| 5,959,356 A | 9/1999 | Oh |

| | | | |
|---|---|---|---|
| 5,969,426 A | 10/1999 | Baba et al. |
| 5,973,388 A | 10/1999 | Chew et al. |
| 5,976,912 A | 11/1999 | Fukutomi et al. |
| 5,977,613 A | 11/1999 | Takata et al. |
| 5,977,615 A | 11/1999 | Yamaguchi et al. |
| 5,977,630 A | 11/1999 | Woodworth et al. |
| 5,981,314 A | 11/1999 | Glenn et al. |
| 5,986,333 A | 11/1999 | Nakamura |
| 5,986,885 A | 11/1999 | Wyland |
| 6,001,671 A | 12/1999 | Fjelstad |
| 6,013,947 A | 1/2000 | Lim |
| 6,018,189 A | 1/2000 | Mizuno |
| 6,020,625 A | 2/2000 | Qin et al. |
| 6,025,640 A | 2/2000 | Yagi et al. |
| 6,031,279 A | 2/2000 | Lenz |
| RE36,613 E | 3/2000 | Ball |
| 6,034,423 A | 3/2000 | Mostafazadeh et al. |
| 6,040,626 A | 3/2000 | Cheah et al. |
| 6,043,430 A | 3/2000 | Chun |
| 6,060,768 A | 5/2000 | Hayashida et al. |
| 6,060,769 A | 5/2000 | Wark |
| 6,072,228 A | 6/2000 | Hinkle et al. |
| 6,075,284 A | 6/2000 | Choi et al. |
| 6,081,029 A | 6/2000 | Yamaguchi |
| 6,084,310 A | 7/2000 | Mizuno et al. |
| 6,087,715 A | 7/2000 | Sawada et al. |
| 6,087,722 A | 7/2000 | Lee et al. |
| 6,100,594 A | 8/2000 | Fukui et al. |
| 6,113,474 A | 9/2000 | Shih et al. |
| 6,114,752 A | 9/2000 | Huang et al. |
| 6,118,174 A | 9/2000 | Kim |
| 6,118,184 A | 9/2000 | Ishio et al. |
| RE36,907 E | 10/2000 | Templeton, Jr. et al. |
| 6,130,115 A | 10/2000 | Okumura et al. |
| 6,130,473 A | 10/2000 | Mostafazadeh et al. |
| 6,133,623 A | 10/2000 | Otsuki et al. |
| 6,140,154 A | 10/2000 | Hinkle et al. |
| 6,143,981 A | 11/2000 | Glenn |
| 6,169,329 B1 | 1/2001 | Farnworth et al. |
| 6,177,718 B1 | 1/2001 | Kozono |
| 6,181,002 B1 | 1/2001 | Juso et al. |
| 6,184,465 B1 | 2/2001 | Corisis |
| 6,184,573 B1 | 2/2001 | Pu |
| 6,194,777 B1 | 2/2001 | Abbott et al. |
| 6,197,615 B1 | 3/2001 | Song et al. |
| 6,198,171 B1 | 3/2001 | Huang et al. |
| 6,201,186 B1 | 3/2001 | Daniels et al. |
| 6,201,292 B1 | 3/2001 | Yagi et al. |
| 6,204,554 B1 | 3/2001 | Ewer et al. |
| 6,208,020 B1 | 3/2001 | Minamio et al. |
| 6,208,021 B1 | 3/2001 | Ohuchi et al. |
| 6,208,023 B1 | 3/2001 | Nakayama et al. |
| 6,211,462 B1 | 4/2001 | Carter, Jr. et al. |
| 6,218,731 B1 | 4/2001 | Huang et al. |
| 6,222,258 B1 | 4/2001 | Asano et al. |
| 6,222,259 B1 | 4/2001 | Park et al. |
| 6,225,146 B1 | 5/2001 | Yamaguchi et al. |
| 6,229,200 B1 | 5/2001 | Mclellan et al. |
| 6,229,205 B1 | 5/2001 | Jeong et al. |
| 6,239,367 B1 | 5/2001 | Hsuan et al. |
| 6,239,384 B1 | 5/2001 | Smith et al. |
| 6,242,281 B1 | 6/2001 | Mclellan et al. |
| 6,256,200 B1 | 7/2001 | Lam et al. |
| 6,258,629 B1 | 7/2001 | Niones et al. |
| 6,281,566 B1 | 8/2001 | Magni |
| 6,281,568 B1 | 8/2001 | Glenn et al. |
| 6,282,095 B1 | 8/2001 | Houghton et al. |
| 6,285,075 B1 | 9/2001 | Combs et al. |
| 6,291,271 B1 | 9/2001 | Lee et al. |
| 6,291,273 B1 | 9/2001 | Miyaki et al. |
| 6,294,100 B1 | 9/2001 | Fan et al. |
| 6,294,830 B1 | 9/2001 | Fjelstad |
| 6,295,977 B1 | 10/2001 | Ripper et al. |
| 6,297,548 B1 | 10/2001 | Moden et al. |
| 6,303,984 B1 | 10/2001 | Corisis |
| 6,303,997 B1 | 10/2001 | Lee |
| 6,307,272 B1 | 10/2001 | Takahashi et al. |
| 6,309,909 B1 | 10/2001 | Ohgiyama |
| 6,316,822 B1 | 11/2001 | Venkateshwaran et al. |
| 6,316,838 B1 | 11/2001 | Ozawa et al. |
| 6,323,550 B1 | 11/2001 | Martin et al. |
| 6,326,243 B1 | 12/2001 | Suzuya et al. |
| 6,326,244 B1 | 12/2001 | Brooks et al. |
| 6,326,678 B1 | 12/2001 | Karnezos et al. |
| 6,335,564 B1 | 1/2002 | Pour |
| 6,337,510 B1 | 1/2002 | Chun-Jen et al. |
| 6,339,255 B1 | 1/2002 | Shin |
| 6,348,726 B1 | 2/2002 | Bayan et al. |
| 6,355,502 B1 | 3/2002 | Kang et al. |
| 6,369,447 B1 | 4/2002 | Mori |
| 6,369,454 B1 | 4/2002 | Chung |
| 6,373,127 B1 | 4/2002 | Baudouin et al. |
| 6,380,048 B1 | 4/2002 | Boon et al. |
| 6,384,472 B1 | 5/2002 | Huang |
| 6,388,336 B1 | 5/2002 | Venkateshwaran et al. |
| 6,395,578 B1 | 5/2002 | Shin et al. |
| 6,400,004 B1 | 6/2002 | Fan et al. |
| 6,410,979 B1 | 6/2002 | Abe |
| 6,414,385 B1 | 7/2002 | Huang et al. |
| 6,420,779 B1 | 7/2002 | Sharma et al. |
| 6,429,508 B1 | 8/2002 | Gang |
| 6,437,429 B1 | 8/2002 | Su et al. |
| 6,444,499 B1 | 9/2002 | Swiss et al. |
| 6,448,633 B1 | 9/2002 | Yee et al. |
| 6,452,279 B1 | 9/2002 | Shimoda |
| 6,459,148 B1 | 10/2002 | Chun-Jen et al. |
| 6,464,121 B1 | 10/2002 | Reijnders |
| 6,476,469 B1 | 11/2002 | Hung et al. |
| 6,476,474 B1 | 11/2002 | Hung |
| 6,482,680 B1 | 11/2002 | Khor et al. |
| 6,498,099 B1 | 12/2002 | McLellan et al. |
| 6,498,392 B1 | 12/2002 | Azuma |
| 6,507,096 B1 | 1/2003 | Gang |
| 6,507,120 B1 | 1/2003 | Lo et al. |
| 6,534,849 B1 | 3/2003 | Gang |
| 6,545,332 B1 | 4/2003 | Huang |
| 6,545,345 B1 | 4/2003 | Glenn et al. |
| 6,559,525 B1 | 5/2003 | Huang |
| 6,566,168 B1 | 5/2003 | Gang |
| 6,583,503 B1 | 6/2003 | Akram et al. |
| 6,603,196 B1 | 8/2003 | Lee et al. |
| 6,624,005 B1 | 9/2003 | Di Caprio et al. |
| 6,667,546 B1 | 12/2003 | Huang et al. |
| 2001/0008305 A1 | 7/2001 | McLellan et al. |
| 2001/0011654 A1 | 8/2001 | Schmidt et al. |
| 2001/0014538 A1 | 8/2001 | Kwan et al. |
| 2002/0024122 A1 | 2/2002 | Jung et al. |
| 2002/0027297 A1 | 3/2002 | Ikenaga et al. |
| 2002/0140061 A1 | 10/2002 | Lee |
| 2002/0140068 A1 | 10/2002 | Lee et al. |
| 2002/0163015 A1 | 11/2002 | Lee et al. |
| 2003/0030131 A1 | 2/2003 | Lee et al. |
| 2003/0073265 A1 | 4/2003 | Hu et al. |
| 2004/0056277 A1 | 3/2004 | Karnezos |
| 2004/0061212 A1 | 4/2004 | Karnezos |
| 2004/0061213 A1 | 4/2004 | Karnezos |
| 2004/0063242 A1 | 4/2004 | Karnezos |
| 2004/0063246 A1 | 4/2004 | Karnezos |
| 2004/0065963 A1 | 4/2004 | Karnezos |

FOREIGN PATENT DOCUMENTS

| | | |
|---|---|---|
| EP | 0393997 | 10/1990 |
| EP | 0459493 | 12/1991 |
| EP | 0720225 | 3/1996 |
| EP | 0720234 | 3/1996 |

| | | |
|---|---|---|
| EP | 0794572 A2 | 10/1997 |
| EP | 0844665 | 5/1998 |
| EP | 0936671 | 8/1999 |
| EP | 0989608 | 3/2000 |
| EP | 1032037 | 8/2000 |
| JP | 55163868 | 12/1980 |
| JP | 5745959 | 3/1982 |
| JP | 58160096 | 8/1983 |
| JP | 59208756 | 11/1984 |
| JP | 59227143 | 12/1984 |
| JP | 60010756 | 1/1985 |
| JP | 60116239 | 8/1985 |
| JP | 60195957 | 10/1985 |
| JP | 60231349 | 11/1985 |
| JP | 6139555 | 2/1986 |
| JP | 629639 | 1/1987 |
| JP | 6333854 | 2/1988 |
| JP | 63067762 | 3/1988 |
| JP | 63188964 | 8/1988 |
| JP | 63205935 | 8/1988 |
| JP | 63233555 | 9/1988 |
| JP | 63249345 | 10/1988 |
| JP | 63289951 | 11/1988 |
| JP | 63316470 | 12/1988 |
| JP | 64054749 | 3/1989 |
| JP | 1106456 | 4/1989 |
| JP | 1175250 | 7/1989 |
| JP | 1205544 | 8/1989 |
| JP | 1251747 | 10/1989 |
| JP | 2129948 | 5/1990 |
| JP | 369248 | 7/1991 |
| JP | 3177060 | 8/1991 |
| JP | 4098864 | 9/1992 |
| JP | 5129473 | 5/1993 |
| JP | 5166992 | 7/1993 |
| JP | 5283460 | 10/1993 |
| JP | 692076 | 4/1994 |
| JP | 6140563 | 5/1994 |
| JP | 6260532 | 9/1994 |
| JP | 7297344 | 11/1995 |
| JP | 7312405 | 11/1995 |
| JP | 864634 | 3/1996 |
| JP | 8083877 | 3/1996 |
| JP | 8125066 | 5/1996 |
| JP | 96-4284 | 6/1996 |
| JP | 8222682 | 8/1996 |
| JP | 8306853 | 11/1996 |
| JP | 98205 | 1/1997 |
| JP | 98206 | 1/1997 |
| JP | 98207 | 1/1997 |
| JP | 992775 | 4/1997 |
| JP | 9293822 | 11/1997 |
| JP | 10022447 | 1/1998 |
| JP | 10163401 | 6/1998 |
| JP | 10199934 | 7/1998 |
| JP | 10256240 | 9/1998 |
| JP | 00150765 | 5/2000 |
| JP | 556398 | 10/2000 |
| JP | 2001060648 | 3/2001 |
| JP | 200204397 | 8/2002 |
| KR | 941979 | 1/1994 |
| KR | 9772358 | 11/1997 |
| KR | 100220154 | 6/1999 |
| KR | 0049944 | 6/2002 |
| WO | 9956316 | 11/1999 |
| WO | 9967821 | 12/1999 |

OTHER PUBLICATIONS

Vishay, "4 Milliohms in the So-8: Vishay Siliconix Sets New Record for Power MOSFET On-Resistance," Press Release from webpage, 3 pages, www.vishay.com/news/releases, Nov. 7, 2002.

Patrick Mannion, "MOSFETs Break out of the Shackles of Wire Bonding," Informational Packet, 5 pages, Electronic Design, Mar. 22, 1999 vol. 47, No. 6, www.elecdesign.com/1999/mar2299/ti/0322ti1.shtml.

METHOD OF MAKING A LEADFRAME FOR SEMICONDUCTOR DEVICES

CROSS-REFERENCE TO RELATED APPLICATIONS

The present application is a divisional of U.S. application Ser. No. 10/781,220 enititled LEADFRAME PACKAGE FOR SEMICONDUCTOR DEVICES filed Feb. 18, 2004, now U.S. Pat. No. 6,844,615, which is a continuation of U.S. application Ser. No. 10/387,801 now U.S. Pat. No. 6,794,740, entitled LEADFRAME PACKAGE FOR SEMICONDUCTOR DEVICES filed Mar. 13, 2003.

STATEMENT RE: FEDERALLY SPONSORED RESEARCH/DEVELOPMENT (Not Applicable)

BACKGROUND OF THE INVENTION

1. Field of the Invention

The present invention relates generally to semiconductor packages and, more particularly, to a leadframe which is adapted to provide improvements in the electrical and thermal performance and the assembly of packaging for transistor devices, such as MOSFET devices.

2. Description of the Related Art

As is known in the electrical arts, certain high power semiconductor devices are fabricated by forming a number of individual, low-power devices in a single semiconductor die or chip, and then "paralleling" such devices, i.e., connecting the individual devices together in parallel within the package of the device to define a single device capable of higher power output. One such device is known as a MOSFET (Metal-Oxide-Semiconductor-Field-Effect-Transistor). MOSFETs and similar devices typically include a die body having a source terminal and a gate terminal disposed on the top surface thereof, and a drain terminal disposed on the bottom surface thereof. In prior art semiconductor packages such as MOSFETs, the source terminal is often connected to the leads of the leadframe of the semiconductor package through the use of multiple, parallel bonded wires. However, the use of such wires often contributes to various deficiencies in the performance of the semiconductor package, including relatively high electrical resistances, high parasitic source-inductance, and the formation of craters and voids in the die caused by the bonding of the wires.

In the prior art, it has been learned that most of the foregoing problems can be eliminated or reduced by replacing the large number of bonded wires from the source terminal of the MOSFET with a single, elongate conductive strap that facilitates the electrical connection of the source terminal to the source leads of the semiconductor package. However, this construction/assembly alternative also has been found to present certain problems. One such problem relates to the differences in the respective thermal coefficients of expansion of the materials of the strap, the semiconductor die (MOSFET), and leadframe. As a result of these differences, these parts experience different amounts of expansion and contraction with changes in the temperature of the semiconductor package. This relative movement of the respective parts causes large sheer stresses to develop in the attachment joints between them, which are typically lap joints of conductive adhesive or solder. These sheer stresses result in degradation of the electrical connection between the strap, die, and substrate and, in particular, in an unacceptably large change or shift in the critical drain-to-source resistance of the semiconductor die. The present invention addresses these deficiencies by providing a leadframe based semiconductor package for semiconductor devices, such as MOSFET devices, which is adapted to provide improvements in electrical and thermal performance. The structural attributes of the present invention and the advantages attendant thereto will be described in more detail below.

SUMMARY OF THE INVENTION

In accordance with the present invention, there is provided a semiconductor package comprising a leadframe which includes a die paddle having an opening formed therein. In addition to the die paddle, the leadframe includes a plurality of leads, at least one of which is disposed in spaced relation to the die paddle. The remaining leads are attached to the die paddle and extend therefrom. Electrically connected to the die paddle is the source terminal of a semiconductor die which also includes a gate terminal and a drain terminal. The gate terminal is itself electrically connected to at least one of the leads disposed in spaced relation to the die paddle. A package body at least partially encapsulates the die paddle, the leads, and the semiconductor die such that portions of the leads and the drain terminal of the semiconductor die are exposed in the package body.

Advantageously, the exposure of the drain terminal of the semiconductor die within the package body allows for the direct electrical connection thereof to an underlying substrate such as a printed circuit board. The source terminal of the semiconductor die may optionally be exposed within the package body of the semiconductor package as well for providing enhanced thermal performance or heat dissipation capability.

The present invention is best understood by reference to the following detailed description when read in conjunction with the accompanying drawings.

BRIEF DESCRIPTION OF THE DRAWINGS

These, as well as other features of the present invention, will become more apparent upon reference to the drawings wherein.

Common reference numerals are used throughout the drawings and detailed description to indicate like elements.

DETAILED DESCRIPTION OF THE INVENTION

Figure 1:
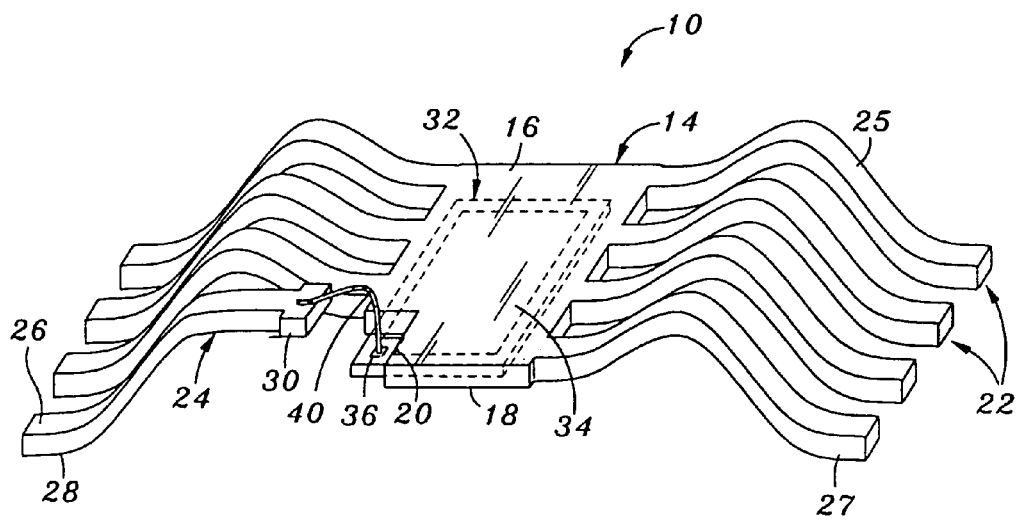
FIG. 1 is a top perspective view of a leadframe for use in a semiconductor package constructed in accordance with a first embodiment of the present invention.

Referring now to the drawings wherein the showings are for purposes of illustrating various embodiments of the present invention only, and not for purposes of limiting the same, FIG. 1 perspectively illustrates a leadframe 10 for use in a semiconductor package 12 (shown in FIG. 2) constructed in accordance with a first embodiment of the present invention. The leadframe 10 comprises a die-attach paddle or die paddle 14 which has a generally quadrangular configuration. As shown in FIG. 1, the die paddle 14 has a rectangular configuration, defining an opposed pair of longitudinal peripheral edge segments and an opposed pair of lateral peripheral edge segments. The die paddle 14 defines a generally planar top surface 16 and an opposed, generally planar bottom surface 18. As best seen in FIG. 1, formed within one of the corner regions of the die paddle 14 is a generally square or rectangular notch 20. The use of the notch 20 will be described in more detail below. Those of ordinary skill in the art will recognize that the notch 20 need not necessarily have a square or rectangular configuration, and need not necessarily extend to respective longitudinal and lateral peripheral edge segments of the die paddle 14. For example, as will be described in detail below in relation to an alternative embodiment of the present invention, the notch 20 may be substituted with an aperture disposed within the die paddle of the leadframe.

In addition to the die paddle 14, the leadframe 10 comprises a plurality of elongate leads 22 which are each attached to and extend from respective ones of the longitudinal peripheral edge segments of the die paddle 14. The leads 22 each define a top surface 25 and an opposed bottom surface 27. In addition to the leads 22, the leadframe 10 includes a single lead 24 which also defines a top surface 26 and an opposed bottom surface 28. In contrast to the leads 22, the lead 24 is not attached to the die paddle 14. Rather, the lead 24 defines an enlarged inner end 30 which is disposed in spaced relation to the die paddle 14 proximate the notch 20 formed therein. It is contemplated that the leadframe 10 including the die paddle 14 and leads 22, 24 will be fabricated from a conductive metallic material. As shown in FIG. 1, a total of seven leads 22 are depicted as being connected to the die paddle 14, though those of ordinary skill in the art will recognize that fewer or greater numbers of leads 22 may be included in the leadframe 10.

The semiconductor package 12 of the first embodiment further includes a semiconductor die 32 including a die body defining opposed, generally planar top and bottom surfaces. Disposed on the top surface of the die body is an enlarged, conductive source terminal 34. As seen in FIG. 1, the source terminal 34 is itself generally rectangular, but also includes a notch formed within one of the four corner regions thereof. Also disposed on the top surface of the die body in the notch defined by the source terminal 34 is a gate terminal 36. Disposed on the bottom surface of the die body of the semiconductor die 32 is an enlarged, conductive drain terminal 38. As will be recognized, the structural attributes of the semiconductor die 32 are exemplary of transistor devices, such as MOSFET devices.

In the semiconductor package 12, the source terminal 34 of the semiconductor die 32 is attached and thus electrically connected to the bottom surface 18 of the die paddle 14. Such connection is preferably accomplished through the use of solder, silver filled epoxy, or a suitable conductive adhesive. The attachment of the semiconductor die 32 to the bottom surface 18 of the die paddle 14 is accomplished such that the gate terminal 36 of the semiconductor die 32 is aligned with and thus exposed within the notch 20 of the die paddle 14 as is seen in FIG. 1. As will be recognized, in view of the conductive connection between the semiconductor die 32 and the die paddle 14, those leads 22 which are physically and electrically connected to the die paddle 14 are those which are intended to form the source connection of the semiconductor package 12 when the same is attached to an underlying substrate such as a printed circuit board (PCB). In the semiconductor package 12, the lead 24 which is spaced from the die paddle 14 is electrically connected to the gate terminal 36 via a conductive wire 40 which extends to the top surface 26 of the lead 24.

Figure 2:
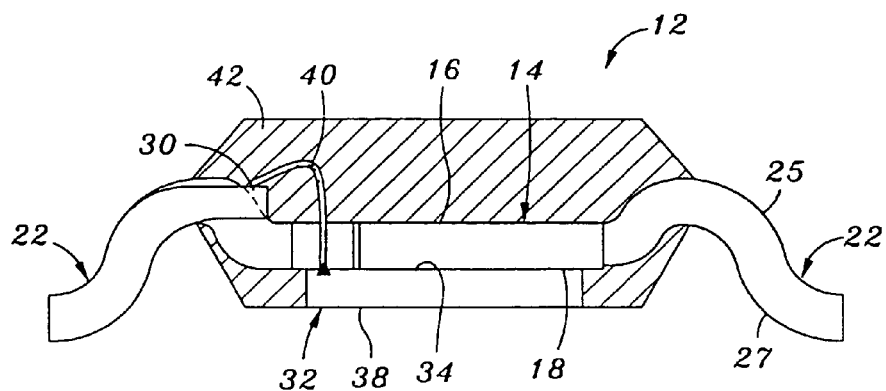
FIG. 2 is a partial cross-sectional view of the semiconductor package of the first embodiment of the present invention.

The semiconductor package 12 of the first embodiment further comprises a package body 42 which fully encapsulates the die paddle 14 and conductive wire 40, and partially encapsulates the leads 22, 24 and semiconductor die 32. The package body 42 is formed from an encapsulant material which is molded about portions of the leadframe 10, and forms the package body 42 upon hardening. The package body 42 is preferably formed such that portions of the leads 22, 24 protrude from respective ones of opposed longitudinal sides of the package body 42. Additionally, the drain terminal 38 of the semiconductor die 32 is exposed in and substantially flush with the bottom surface of the package body 42 as seen in FIG. 2. Advantageously, the drain terminal 38 on the bottom surface of the die body of the semiconductor die 32 is not electrically interconnected, but instead remains exposed after the molding of the package body 42 allowing for direct attachment to an underlying substrate such as a printed circuit board (PCB).

In the semiconductor package 12, the leads 22, 24 are each bent to assume the configurations shown in FIG. 1. More particularly, the leads 22, 24 are bent such that portions of the bottom surfaces 27, 28 thereof adjacent the distal ends are downset relative to the bottom surface 18 of the die paddle 14. In designing the leadframe 10 for the semiconductor package 12, the thickness of the die body of the semiconductor die 32 is taken into account such that the drain terminal 38, the bottom surface of the package body 42, and distal portions of the bottom surfaces 27, 28 of the leads 22, 24 extend in generally co-planar relation to each other. Such relative orientations allow the exposed drain terminal 38 of the semiconductor die 32 to form the drain connection for the semiconductor package 12 by being directly attached and electrically connected to the printed circuit board. As will be recognized, when the leadframe 10 is placed into a mold cavity to facilitate the formation of the package body 42, the drain terminal 38 of the semiconductor die 32 will be placed in direct contact with one surface of such mold cavity. In the semiconductor package 12, the lead 24 forms the gate connection when attached to the printed circuit board. The notch 20 of the die paddle 14 allows a single wire bond to connect the gate terminal 36 of the semiconductor die 32 to the lead 24. As indicated above, the leads 22 of the semiconductor package 12 are those which form the source connections when attached to the printed circuit board.

Figure 3:
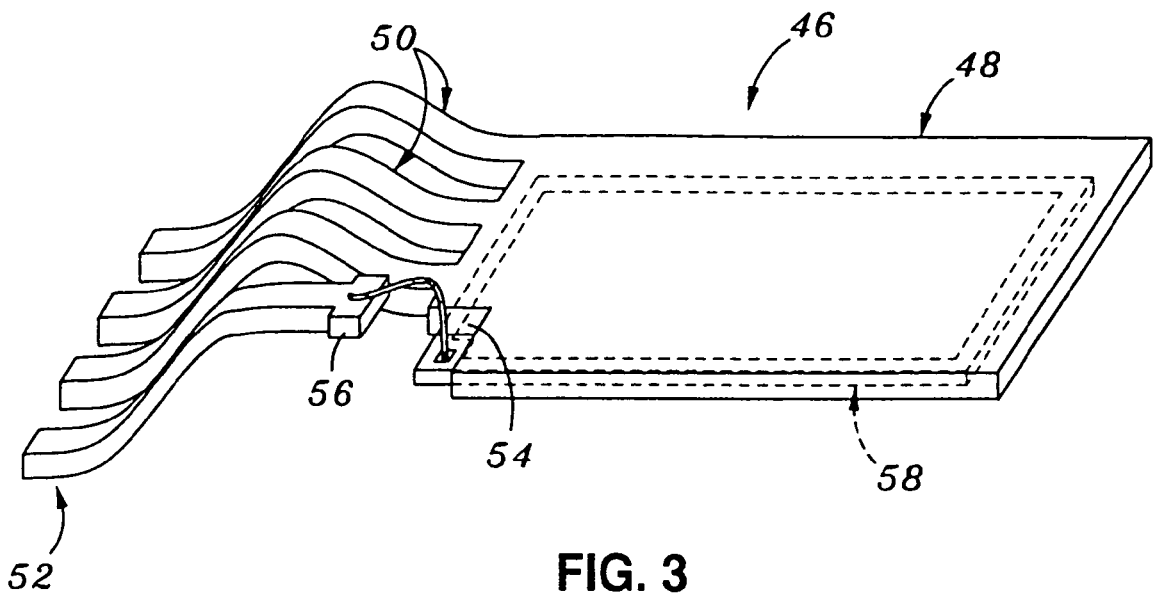
FIG. 3 is a top perspective view of a leadframe for use in a semiconductor package constructed in accordance with a second embodiment of the present invention.
Figure 4:
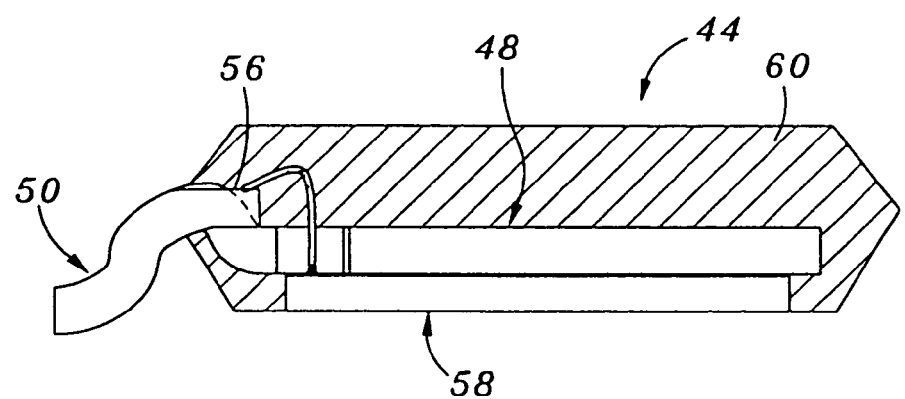
FIG. 4 is a partial cross-sectional view of the semiconductor package of the second embodiment of the present invention.

Referring now to FIGS. 3 and 4, there is shown a semiconductor package 44 constructed in accordance with a second embodiment of the present invention. The semiconductor package 44 of the second embodiment is similar in construction to the above-described semiconductor package 12 of the first embodiment. The distinction in the semiconductor package 44 lies primarily in the configuration of the leadframe 46 thereof. More particularly, the leadframe 46 includes a generally rectangular die paddle 48 which defines opposed pairs of longitudinal and lateral peripheral edge segments. The leadframe 46 also includes leads 50 which are identically configured to the above-described leads 22 and are attached to a common lateral peripheral edge segment of the die paddle 48. In addition to the leads 50, the leadframe 46 includes a lead 52 which is identically configured to the above-described lead 24 and is disposed in spaced relation to that lateral peripheral edge segment of the die paddle 48 having the leads 50 attached thereto and extending therefrom. Like the die paddle 14, the die paddle 48 includes a notch 54 disposed within one of the four corner regions defined thereby proximate to the enlarged inner end 56 of the lead 52.

Also included in the semiconductor package 44 of the second embodiment is a semiconductor die 58 which is identically configured to the above-described semiconductor die 32. The attachment and electrical connection of the semiconductor die 58 to the leadframe 46 in the semiconductor package 44 of the second embodiment is completed in the same manner described above in relation to the semiconductor package 12 of the first embodiment. The encapsulation of portions of the semiconductor die 58 and leadframe 46 with an encapsulating material to form a package body 60 of the semiconductor package 44 also occurs in the same manner described above in relation to the semiconductor package 12. However, as will be recognized, in the completed semiconductor package 44 of the second embodiment, the leads 50, 52 protrude from only one lateral side of the package body 60 since the leads 50, 52 extend along only one common lateral peripheral edge segment of the die paddle 48 of the leadframe 46 as indicated above.

Figure 5:
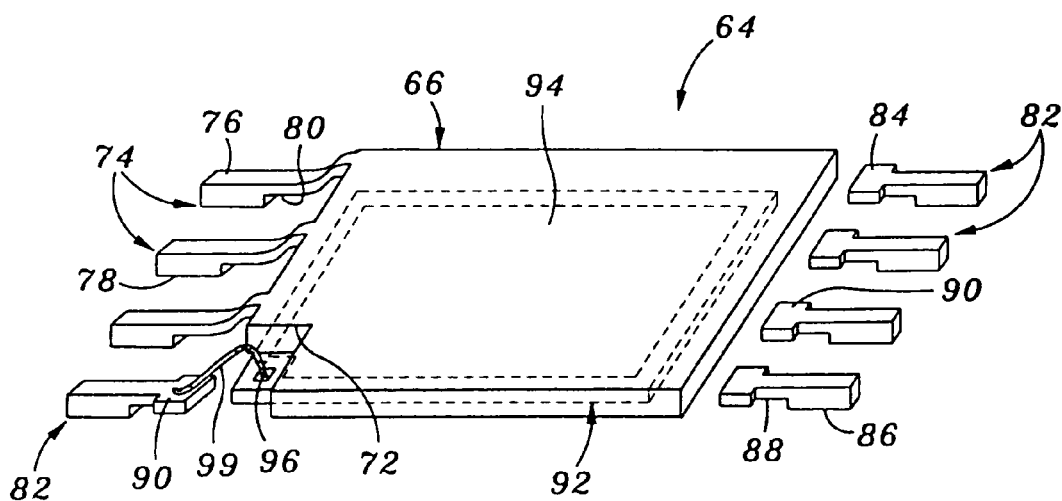
FIG. 5 is a top perspective view of a leadframe for use in a semiconductor package constructed in accordance with a third embodiment of the present invention.
Figure 6:
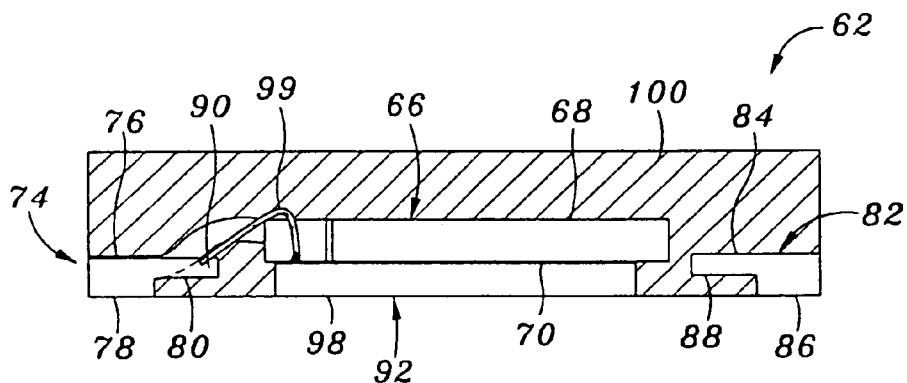
FIG. 6 is a partial cross-sectional view of the semiconductor package of the third embodiment of the present invention.

Referring now to FIGS. 5 and 6, there is shown a semiconductor package 62 constructed in accordance with a third embodiment of the present invention. The semiconductor package 62 includes a leadframe 64 which comprises a generally rectangular die paddle 66 defining opposed pairs of longitudinal and lateral peripheral edge segments. The die paddle 66 further defines a generally planar top surface 68 and an opposed, generally planar bottom surface 70. Formed within one of the corner regions of the die paddle 66 is a generally square or rectangular notch 72.

In addition to the die paddle 66, the leadframe 64 comprises a plurality of leads 74 which are each attached to and extend from one of the lateral peripheral edge segments of the die paddle 66. The leads 74 each define a top surface 76 and an opposed bottom surface 78. Each of the leads 74 further defines a half-etched surface 80 which is also disposed in opposed relation to the top surface 76 and is laterally offset or perpendicularly recessed relative to the bottom surface 78.

In addition to the leads 74, the leadframe 64 includes a plurality of leads 82 which also each define a top surface 84, a bottom surface 86 which is disposed in opposed relation to the top surface 84, and a half-etched surface 88 which is also disposed in opposed relation to the top surface 84 and laterally offset or perpendicularly recessed relative to the bottom surface 86. Each of the leads 82 further defines an enlarged inner end 90. In contrast to the leads 74, the leads 82 are not attached to the die paddle 66. Rather, one of the leads 82 is disposed along but spaced from that lateral peripheral edge segment of the die paddle 66 having the leads 74 attached thereto, with such lead 82 being proximate the notch 72 formed in the die paddle 66. The remaining leads 82 are disposed along but spaced from the remaining, opposed lateral peripheral edge segment of the die paddle 66. It is contemplated that the leadframe 64 will also be fabricated from a conductive metallic material. As shown in FIG. 5, a total of three leads 74 and five leads 72 are included in the leadframe 64, though those of ordinary skill in the art will recognize that fewer or greater numbers of leads 74, 82 may be included therein.

The semiconductor package 62 of the third embodiment further includes a semiconductor die 92 which is identically configured to the above-described semiconductor die 32. The semiconductor die 92 includes a die body defining opposed, generally planar top and bottom surfaces. Disposed on the top surface of the die body is an enlarged, conductive source terminal 94. The source terminal 94 is itself generally rectangular, but also includes a notch formed within one of the four corner regions thereof. Also disposed on the top surface of the die body in the notch defined by the source terminal 94 is a gate terminal 96. Disposed on the bottom surface of the die body of the semiconductor die 92 is an enlarged, conductive drain terminal 98.

In the semiconductor package 62 of the third embodiment, the source terminal 94 of the semiconductor die 92 is attached and thus electrically connected to the bottom surface 70 of the die paddle 66. Such connection is preferably accomplished through the use of solder, silver filled epoxy, or a suitable conductive adhesive. The attachment of the semiconductor die 92 to the bottom surface 70 of the die paddle 66 is accomplished such that the gate terminal 96 of the semiconductor die 92 is aligned with and thus exposed within the notch 72 of the die paddle 66 as is seen in FIG. 5. The lead 82 which is disposed proximate the notch 72 is electrically connected to the gate terminal 96 via a conductive wire 99 which extends to the top surface 84 of such lead 82 at the inner end 90 thereof.

The semiconductor package 62 of the third embodiment further comprises a package body 100 which fully encapsulates the die paddle 66 and conductive wire 99, and partially encapsulates the leads 74, 82 and semiconductor die 92. The package body 100 is formed in the same manner described above in relation to the package body 42 of the first embodiment. The package body 100 is preferably formed such that the bottom surfaces 78, 86 of the leads 74, 82 are exposed in and substantially flush with the bottom surface of the package body 100. Additionally, as seen in FIG. 6, the outer, distal ends of the leads 74, 82 are exposed in and substantially flush with respective ones of the multiple side surfaces defined by the package body 100. Further, the drain terminal 98 of the semiconductor die 92 is exposed in and substantially flush with the bottom surface of the package body 100. The exposure of the drain terminal 98 in the package body 100 allows for direct attachment to an underlying substrate.

As seen in FIG. 6, the encapsulant material used to form the package body 100 underfills and thus covers the half-etched surfaces 80, 88 of the leads 74, 82, thus enhancing the mechanical interlock therebetween. Those leads 82 of the set extending along the lateral peripheral edge segment of the die paddle 66 opposite that having the leads 74 attached thereto may be used as additional source leads, depending on the application for the semiconductor package 62. The lead 82 disposed closest to the leads 74 forms the gate connection when attached to an underlying substrate such as a printed circuit board. The leads 74 are those which form the source connections for the semiconductor package 62 when attached to the printed circuit board.

Figure 7:
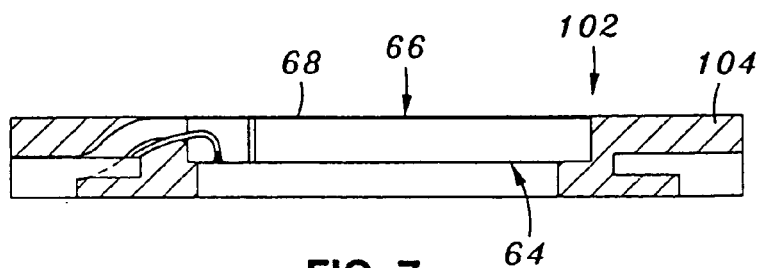
FIG. 7 is a partial cross-sectional view of a semiconductor package constructed in accordance with a fourth embodiment of the present invention, including the leadframe of the third embodiment shown in FIG. 5.

Referring now to FIG. 7, there is shown a semiconductor package 102 constructed in accordance with a fourth embodiment of the present invention. The semiconductor package 102 is identically configured to the semiconductor package 62 of the third embodiment in all respects, except that the package body 104 of the semiconductor package 102 is formed of reduced thickness as compared to the package body 100. More particularly, the thickness of the package body 104 is such that the top surface 68 of the die paddle 66 of the leadframe 64 also included in the semiconductor package 102 is exposed in and substantially flush with the top surface of the package body 104. As will be recognized, the exposure of the top surface 68 of the die paddle 66 in the top surface of the package body 104 in the semiconductor package 102 provides increased thermal performance and the ability for external heatsinking. Additionally, the reduced thickness of the package body 104 allows for a reduction in the total package height of the semiconductor package 102.

Figure 8:
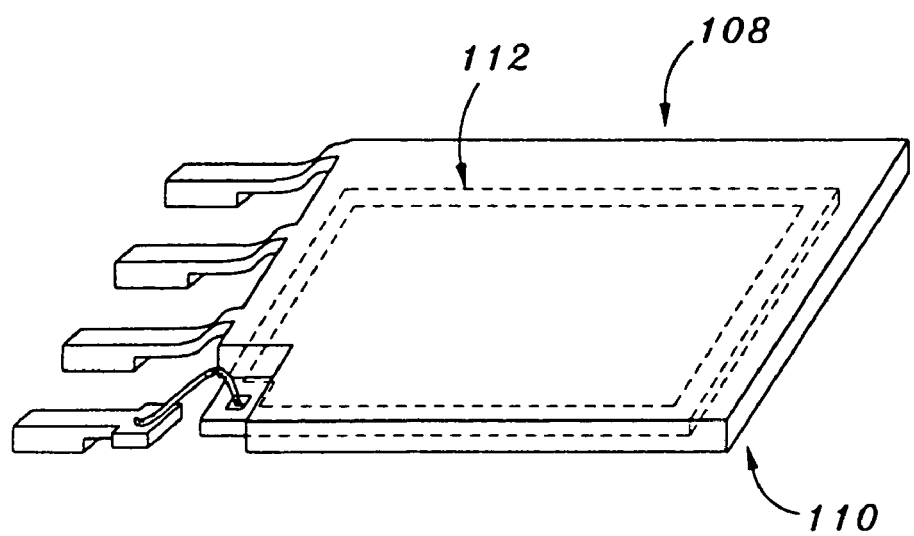
FIG. 8 is a top perspective view of a leadframe for use in a semiconductor package constructed in accordance with a fifth embodiment of the present invention.
Figure 9:
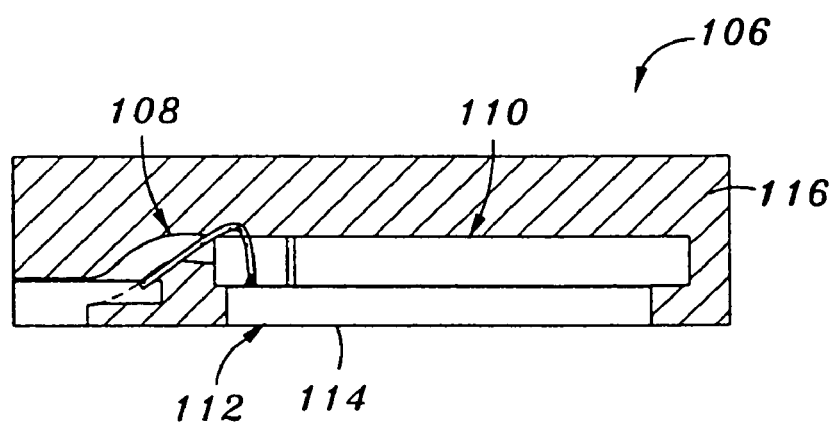
FIG. 9 is a partial cross-sectional view of the semiconductor package of the fifth embodiment of the present invention.

Referring now to FIGS. 8 and 9, there is shown a semiconductor package 106 constructed in accordance with a fifth embodiment of the present invention. The semiconductor package 106 of the fifth embodiment is substantially similar in construction to the above-described semiconductor package 62 of the third embodiment. The distinction lies in the configuration of the leadframe 108 of the semiconductor package 106 in comparison to the leadframe 64 of the semiconductor package 62. More particularly, the leadframe 108 is identical to the leadframe 64 in all respects, except that those leads 82 of the leadframe 64 extending along the lateral peripheral edge segment of the die paddle 66 opposite that including the leads 74 attached thereto are omitted in the leadframe 108. As a result of such omission, the die paddle 110 of the leadframe 108 may optionally be formed to be of larger size as compared to the die paddle 66, thus allowing for the attachment of a semiconductor die 112 thereto which is larger than the above-described semiconductor die 92 while keeping the overall footprint of the semiconductor package 106 substantially the same as that of the semiconductor package 62. The omission of the aforementioned set of leads 82 in the semiconductor package 106 also allows for the placement of the exposed drain terminal 114 of the semiconductor die 112 over the traditional lands of a printed circuit board, thus allowing complete footprint compatibility with traditional packaging. As will be recognized, the omission of the above-described set of leads 82 in the semiconductor package 106 results in the exposed bottom surfaces of those leads included in the leadframe 108 extending along only one side of the package body 116 of the semiconductor package 102.

Figure 10:
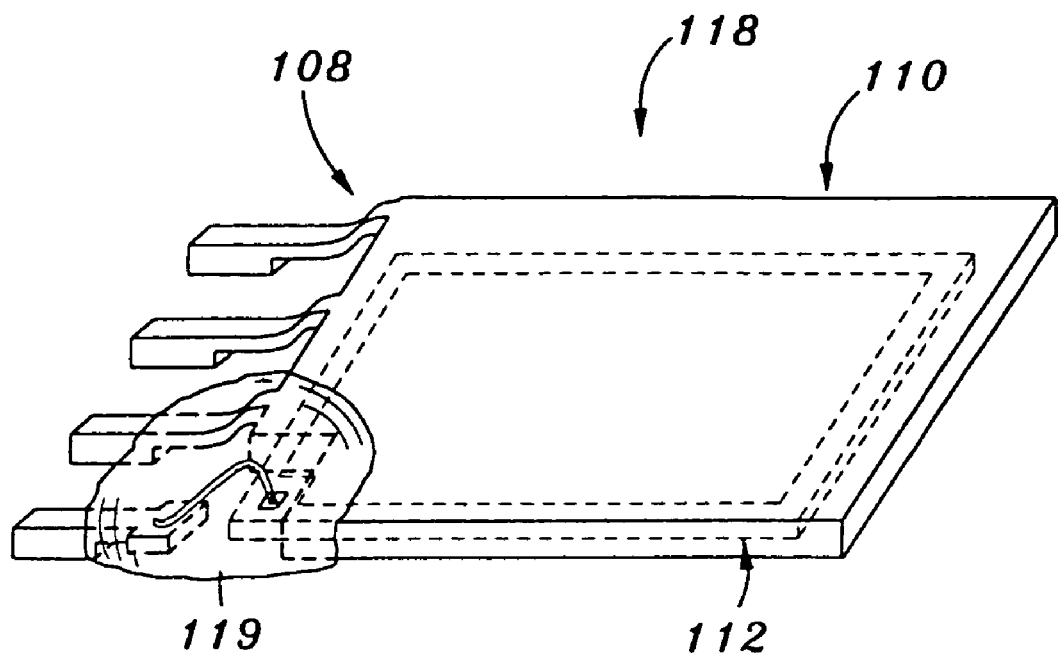
FIG. 10 is a top perspective view of a leadframe for use in a semiconductor package constructed in accordance with a sixth embodiment of the present invention.
Figure 11:
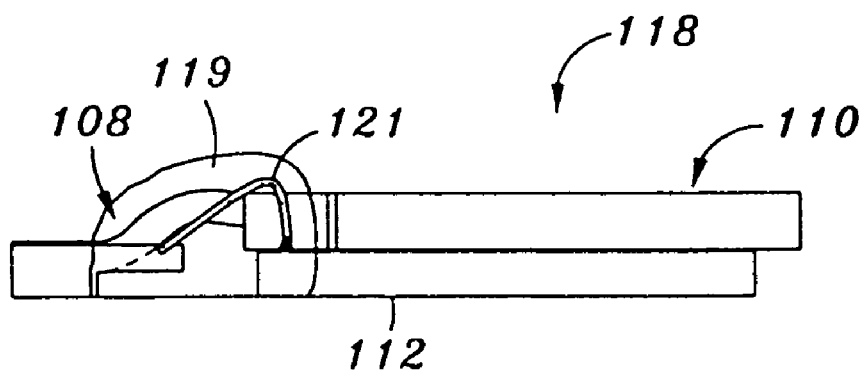
FIG. 11 is a partial cross-sectional view of the semiconductor package of the sixth embodiment of the present invention.

Referring now to FIGS. 10 and 11, there is shown a semiconductor package 118 constructed in accordance with a sixth embodiment of the present invention. The semiconductor package 118 is substantially similar to the above-described semiconductor package 106, except that the package body 116 of the semiconductor package 106 is omitted from the semiconductor package 118. In this regard, in the semiconductor package 118, a layer 119 of glob top encapsulant is applied to a portion of the above-described leadframe 108 included in the semiconductor package 118 as effectively encapsulates the conductive wire 121 used to electrically connect the sole lead of the leadframe 108 which is spaced from the die paddle 110 to the semiconductor die 112. Thus, as indicated above, no package body is included in the semiconductor package 118.

Figure 12:
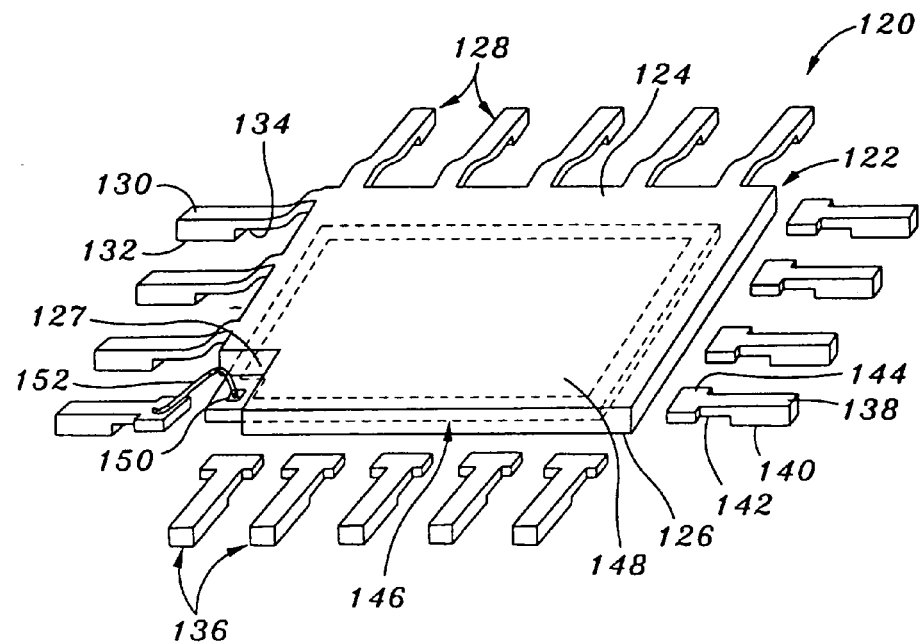
FIG. 12 is a top perspective view of a leadframe for use in a semiconductor package constructed in accordance with a seventh embodiment of the present invention.

Referring now to FIG. 12, there is shown a leadframe 120 for use in a semiconductor package constructed in accordance with a seventh embodiment of the present invention. The leadframe 120 comprises a die-attach paddle or die paddle 122 which has a generally quadrangular configuration defining four peripheral edge segments. The die paddle 122 defines a generally planar top surface 124 and an opposed, generally planar bottom surface 126. Formed within one of the corner regions of the die paddle 122 is a notch 127.

In addition to the die paddle 122, the leadframe 120 comprises a plurality of leads 128 which are each attached to and extend from respective ones of the peripheral edge segments of the die paddle 122. The leads 128 each define a top surface 130 and an opposed bottom surface 132. Each of the leads 128 further defines a half-etched surface 134 which is also disposed in opposed relation to the top surface 130 and is laterally offset or perpendicularly recessed relative to the bottom surface 132.

In addition to the leads 128, the leadframe 120 includes a plurality of leads 136 which also each define a top surface 138, a bottom surface 140 which is disposed in opposed relation to the top surface 138, and a half-etched surface 142 which is also disposed in opposed relation to the top surface 138 and laterally offset or perpendicularly recessed relative to the bottom surface 140. Each of the leads 136 further defines an enlarged inner end 144. In contrast to the leads 128, the leads 136 are not attached to the die paddle 122. Rather, one of the leads 136 is disposed along but spaced from that peripheral edge segment of the die paddle 122 having certain ones of the leads 128 attached thereto, with such lead 136 being proximate the notch 127 formed in the die paddle 122. The remaining leads 136 are disposed along but spaced from respective ones of two of the remaining peripheral edge segments of the die paddle 122. It is contemplated that the leadframe 120 will also be fabricated from a conductive metallic material.

The semiconductor package of the seventh embodiment constructed to include the leadframe 120 also includes a semiconductor die 146 which is identically configured to the above-described semiconductor die 32. The semiconductor die 146 includes a die body defining opposed, generally planar top and bottom surfaces. Disposed on the top surface of the die body is an enlarged, conductive source terminal 148. The source terminal 148 is itself generally quadrangular, but also includes a notch formed within one of the four corner regions thereof. Also disposed on the too surface of the die body in the notch defined by the source terminal 148 is a gate terminal 150. Disposed on the bottom surface of the die body of the semiconductor die 146 is an enlarged, conductive drain terminal (not shown).

Similar to the above-described embodiments of the semiconductor package, the source terminal 148 of the semiconductor die 146 is attached and thus electrically connected to the bottom surface 126 of the die paddle 122. Such connection is preferably accomplished through the use of solder, silver filled epoxy, or a suitable conductive adhesive. The attachment of the semiconductor die 146 to the bottom surface 126 of the die paddle 122 is accomplished such that the gate terminal 150 of the semiconductor die 146 is aligned with and thus exposed within the notch 127 of the die paddle 122 as is seen in FIG. 12. The lead 136 which is disposed proximate the notch 127 is electrically connected to the gate terminal 150 via a conductive wire 152 which extends to the top surface 138 of such lead 136 at the inner end 144 thereof.

Though not shown, the semiconductor package of the seventh embodiment of the present invention further comprises a package body which is formed in the same manner described above in relation to the semiconductor package 62 of the third embodiment. In this regard, the semiconductor package of the seventh embodiment is substantially similar in construction to the semiconductor package 62 of the third embodiment, with the sole distinction being the inclusion of the leads 128, 136 which extend along all four peripheral edge segments of the die paddle 122, as opposed to extending along only an opposed pair of the peripheral edge segments of the die paddle 122 as is the case with the leads 74, 82 and die paddle 66 of the leadframe 64 included in the semiconductor package 62 of the third embodiment. Thus, in the semiconductor package constructed in accordance with the seventh embodiment, the outer, distal ends of the leads 128, 136 are exposed in and substantially flush with respective ones of multiple side surfaces defined by the package body, with the drain terminal of the semiconductor die 146 and the bottom surfaces 132, 140 of the leads 128, 136 being exposed in and substantially flush with the bottom surface of the package body. The encapsulant material used to form the package body also underfills and thus covers the half-etched surfaces 134, 142 of the leads 128, 136.

Figure 13:
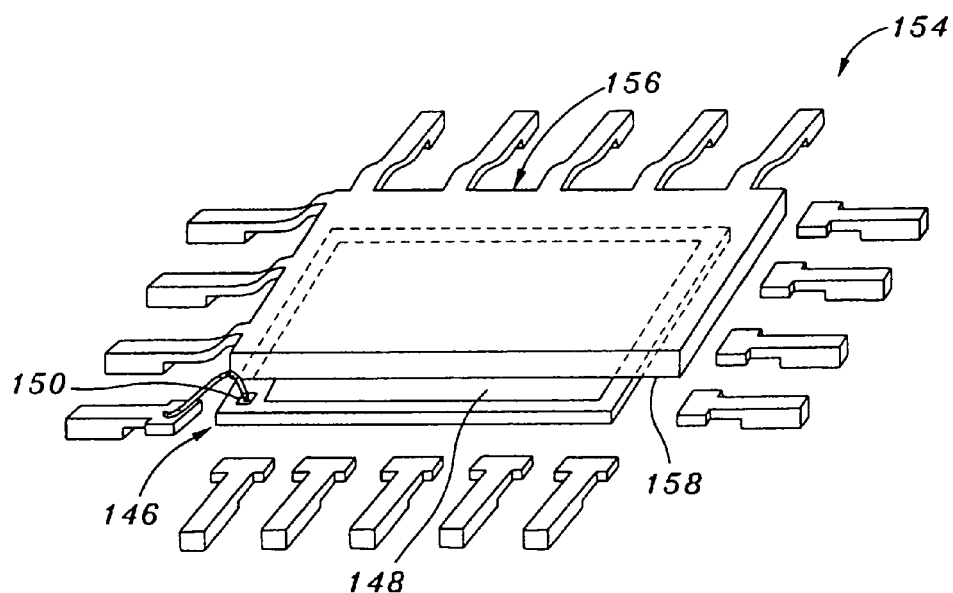
FIG. 13 is a top perspective view of a leadframe for use in a semiconductor package constructed in accordance with an eighth embodiment of the present invention.

Referring now to FIG. 13, there is shown a leadframe 154 for use in a semiconductor package constructed in accordance with an eighth embodiment of the present invention. The leadframe 154 of the eighth embodiment is substantially similar in construction to the above-described leadframe 120. In this regard, the sole distinction between the leadframes 120, 154 is that the die paddle 156 of the leadframe 154 is made smaller than the die paddle 122 of the leadframe 120. As is seen in FIG. 13, the size difference between the die paddle 122, 156 is such that the source terminal 148 of the above-described semiconductor die 146 may be attached to the bottom surface 158 of the die paddle 156 in a manner wherein a peripheral edge portion of the semiconductor die 146 is not covered by the die paddle 156 and thus exposed. That portion of the semiconductor die 146 which is exposed includes the gate terminal 150 and optionally a portion of the source terminal 48. The smaller size of the die paddle 156 in the leadframe 154 and resultant exposure of the gate terminal 150 of the semiconductor die 146 thus eliminates the need for the notch 127 included in the die paddle 122 of the leadframe 120.

Figure 14:
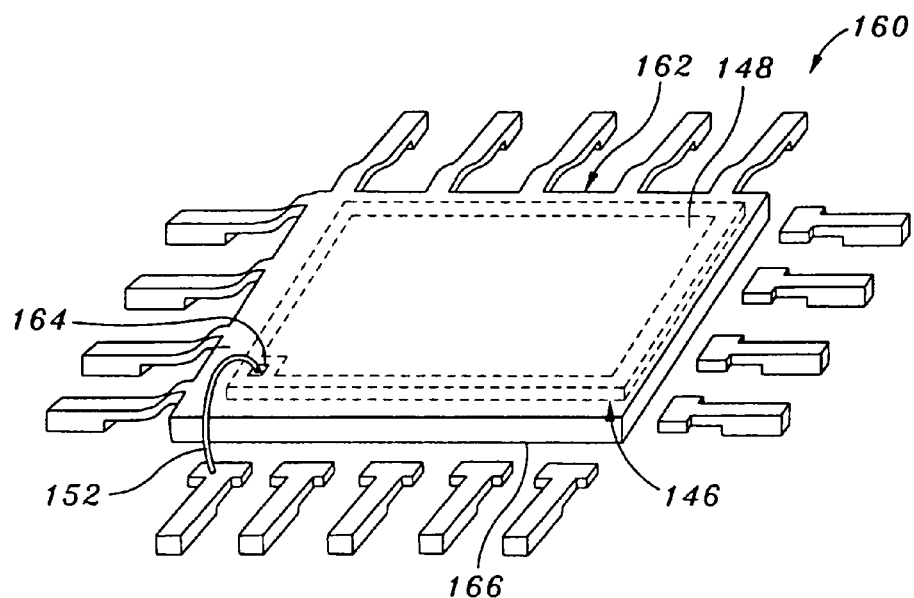
FIG. 14 is a top perspective view of a leadframe for use in a semiconductor package constructed in accordance with a ninth embodiment of the present invention.

Referring now to FIG. 14, there is shown a leadframe 160 for use in a semiconductor package constructed in accordance with a ninth embodiment of the present invention. The leadframe 160 is also substantially similar in construction to the above-described leadframe 120. However, the die paddle 162 of the leadframe 160 also does not include the above-described notch 127 disposed in the die paddle 122 of the leadframe 120. Rather, disposed in the die paddle 162 of the leadframe 160 is an aperture 164. The aperture 164 is oriented such that when the source terminal 148 of the above-described semiconductor die 146 is attached to the bottom surface 166 of the die paddle 162, the gate terminal 150 of the semiconductor die 146 is substantially aligned with the aperture 164, thus allowing one end of the above-described conductive wire 152 to be advanced to the gate terminal 150.

Figure 15:
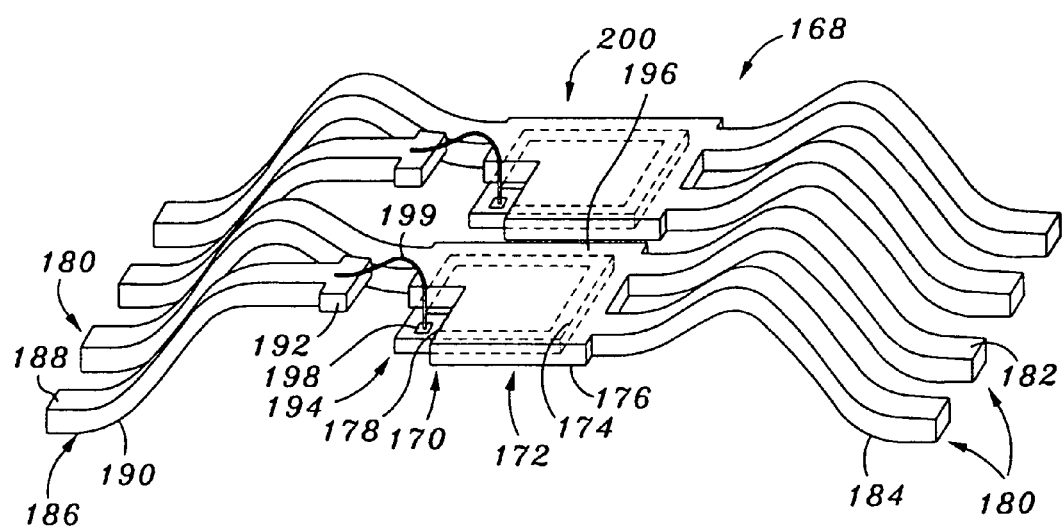
FIG. 15 is a top perspective view of a leadframe for use in a semiconductor package constructed in accordance with a tenth embodiment of the present invention.

Referring now to FIG. 15, there is shown a leadframe 168 for use in a semiconductor package constructed in accordance with a tenth embodiment of the present invention. The leadframe 168 comprises a first subassembly 170 which bears substantial structural similarity to the leadframe 10 of the first embodiment described above. More particularly, the first subassembly 170 comprises a die paddle 172 which has a generally quadrangular configuration. The die paddle 172 defines a generally planar top surface 174 and an opposed, generally planar bottom surface 176. Formed within one of the corner regions of the die paddle 172 is a notch 178.

In addition to the die paddle 172, the first subassembly 170 comprises a plurality of elongate leads 180 which are attached to and extend from respective ones of an opposed pair of peripheral edge segments of the die paddle 172. The leads 180 each define a top surface 182 and an opposed bottom surface 184. In addition to the leads 180, the first subassembly 170 includes a single lead 186 which also defines a top surface 188 and an opposed bottom surface 190. In contrast to the leads 180, the lead 186 is not attached to the die paddle 172. Rather, the lead 186 defines an enlarged inner end 192 which is disposed in spaced relation to the die paddle 172 proximate the notch 178 formed therein. It is contemplated that the die paddle 172 and leads 180, 186 will be fabricated from a conductive metallic material. As shown in FIG. 15, a total of three leads 180 are depicted as being connected to the die paddle 172, though those of ordinary skill in the art will recognize that fewer or greater numbers of leads 180 may be included in the first subassembly 170.

The first subassembly 170 of the leadframe 168 further includes a semiconductor die 194 including a die body defining opposed, generally planar top and bottom surfaces. Disposed on the top surface of the die body is an enlarged, conductive source terminal 196. The source terminal 196 also includes a notch formed within one of the four corner regions thereof. Also disposed on the top surface of the die body in the notch defined by the source terminal 196 is a gate terminal 198. Disposed on the bottom surface of the die body of the semiconductor die 194 is an enlarged, conductive drain terminal (not shown).

The source terminal 196 of the semiconductor die 194 is attached and thus electrically connected to the bottom surface 176 of the die paddle 172. Such connection is preferably accomplished through the use of solder, silver filled epoxy, or a suitable conductive adhesive. The attachment of the semiconductor die 194 to the bottom surface 176 is accomplished such that the gate terminal 198 of the semiconductor die 194 is aligned with and thus exposed within the notch 178 of the die paddle 172. In the first subassembly 170 of the leadframe 168, the leads 180, 186 are each bent to assume the configuration shown in FIG. 15. More particularly, the leads 180, 186 are bent such that portions of the bottom surfaces 184, 190 thereof adjacent the distal ends are downset relative to the bottom surface 176 of the die paddle 172. In this regard, the leads 180, 186 are preferably bent such that the distal portions of the bottom surfaces 184, 190 extend in generally co-planar relation to the drain terminal of the semiconductor die 194. In the first subassembly 170, the lead 186 which is spaced from the die paddle 172 is electrically connected to the gate terminal 198 via a conductive wire 199 which extends to the top surface 188 of the lead 186.

In addition to the first subassembly 170, the leadframe 168 comprises a second subassembly 200 which is identically configured to the first subassembly 170 and disposed in spaced, side-by-side relation thereto in the manner shown in FIG. 15. Though not shown, the semiconductor package of the tenth embodiment further comprises a package body which is substantially similar in construction to the above-described package body 42 of the semiconductor package 12. In this regard, the package body of the tenth embodiment is formed to partially encapsulate the first and second subassemblies 170, 200 such that portions of the leads 180, 186 of the first subassembly 170 and the leads of the second subassembly 200 protrude from the package body, with the drain terminals of the semiconductor die 194 of the first subassembly 170 and the semiconductor die of the second subassembly 200 being exposed in and substantially flush with the bottom surface of the package body. Thus, the semiconductor package of the tenth embodiment includes multiple semiconductor dies in a single semiconductor package configuration. Though not shown, those of ordinary skill in the art will recognize that other embodiments of the semiconductor package may be similarly modified to include more than one semiconductor die.

This disclosure provides exemplary embodiments of the present invention. The scope of the present invention is not limited by these exemplary embodiments. Numerous variations, whether explicitly provided for by the specification or implied by the specification, such as variations in structure, dimension, type of material and manufacturing process may be implemented by one of skill in the art in view of this disclosure. For example, in those embodiments of the leadframe which include two sets of leads extending along respective ones of an opposed pair of peripheral edge segments of the corresponding die paddle, such leads may extend along either an opposed pair of lateral peripheral edge segments or an opposed pair of longitudinal peripheral edge segments in the event the die paddle is rectangular. Additionally, in any embodiment of the leadframe of the present invention, the die paddle may be generally square, with the corresponding leads extending along any opposed pair or any adjacent pair of peripheral edge segments thereof, or along all four peripheral edge segments in the case of the quad configurations shown in FIGS. 12–14. Moreover, alternative attachment methods such as a flip-chip type attachment or solder bump methods may be employed to facilitate the attachment of the source terminal of any semiconductor die to the bottom surface of the corresponding die paddle.

The invention claimed is:

1. A method of fabricating a semiconductor package, comprising the steps of:
   a) providing a leadframe which includes at least two leads and a die paddle having an opening formed therein, one of the leads being disposed in spaced relation to the die paddle, with the remaining one of the leads being attached to the die paddle;
   b) providing at least one semiconductor die having a source terminal, a gate terminal and a drain terminal;
   c) electrically connecting the source terminal to the die paddle and the gate terminal to the at least one of the leads disposed in spaced relation to the die paddle; and
   d) at least partially encapsulating the die paddle, the leads and the semiconductor die with a package body such that at least portions of the leads and the drain terminal of the semiconductor die are exposed in the package body.

2. The method of claim 1 wherein:
   step (a) comprises providing a leadframe wherein the die paddle defines opposed top and bottom surface; and
   step (c) comprises electrically connecting the source terminal of the semiconductor die to the bottom surface of the die paddle such that the gate terminal is aligned with and exposed in the opening.

3. The method of claim 2 wherein:
   step (c) comprises electrically connecting the at least one lead disposed in spaced relation to the die paddle to the gate terminal of the semiconductor die via a conductive wire; and
   step (d) comprises encapsulating the conductive wire with the package body.

4. The method of claim 2 wherein:
   step (a) comprises providing a leadframe wherein the leads each define opposed top and bottom surfaces; and
   step (d) comprises forming the package body to define a bottom surface and a side surface such that the drain terminal of the semiconductor die is exposed in the bottom surface of the package body and a portion of each of the leads protrudes from the side surface of the package body.

5. The method of claim 4 wherein step (a) comprises providing a leadframe wherein the die paddle has a generally quadrangular configuration defining an opposed pair of peripheral edge segments, and a plurality of the leads are included and segregated into two sets which are disposed along respective ones of the opposed peripheral edge segments of the die paddle.

6. The method of claim 5 where step (a) comprises providing a leadframe wherein at least one of the leads of each of the sets is attached to the die paddle.

7. The method of claim 4 wherein step (a) comprises providing a leadframe wherein the die paddle has a generally quadrangular configuration defining at least four peripheral edge segments, and the leads are disposed along a common one of the peripheral edge segments of the die paddle.

8. The method of claim 2 wherein:
   step (a) comprises providing a leadframe wherein each of the leads defines opposed top and bottom surfaces; and
   step (d) comprises forming the package body to define a bottom surface such that the drain terminal of the semiconductor die and at least a portion of the bottom surface of each of the leads is exposed in the bottom surface of the package body.

9. The method of claim 8 wherein step (a) comprises providing a leadframe wherein the die paddle has a generally quadrangular configuration defining an opposed pair of peripheral edge segments, and a plurality of the leads are included and segregated into two sets which are disposed along respective ones of the opposed peripheral edge segments of the die paddle.

10. The method of claim 9 wherein step (a) comprises providing a leadframe wherein at least one of the leads of each of the sets is disposed in spaced relation to the die paddle.

11. The method of claim 8 wherein step (a) comprises providing a leadframe wherein the die paddle has a generally quadrangular configuration defining at least four peripheral edge segments, and the leads are disposed along a common one of the peripheral edge segments of the die paddle.

12. The method of claim 8 wherein step (a) comprises providing a leadframe wherein the die paddle has a generally quadrangular configuration defining at least four peripheral edge segments, and a plurality of the leads are included and disposed along each of the peripheral edge segments of the die paddle.

13. The method of claim 8 wherein step (a) comprises providing a leadframe wherein each of the leads includes a half-etched portion which is encapsulated by the package body.

14. The method of claim 2 wherein step (d) comprises forming the package body to define opposed top and bottom surfaces such that the drain terminal of the semiconductor die is exposed in the bottom surface of the package body and the top surface of the die paddle is exposed in the top surface of the package body.

15. The method of claim 2 wherein step (a) comprises providing a leadframe wherein the die paddle has a generally quadrangular configuration defining at least four corner regions, and the opening comprises a notch formed in one of the four corner regions of the die paddle.

16. The method of claim 2 wherein step (a) comprises providing a leadframe wherein the opening comprises an aperture disposed in the die paddle.

17. The method of claim 1 wherein step (a) comprises providing a leadframe wherein the die paddle is sized and configured relative to the semiconductor die such that the gate terminal of the semiconductor die is not covered by the die paddle and thus exposed when the source terminal is electrically connected to the die paddle in step (c).

18. A method of fabricating a semiconductor package, comprising the steps of:
  a) providing a leadframe having at least two leads and a die paddle including an opening formed therein, one of the leads being disposed in spaced relation to the die paddle, with the remaining one of the leads being attached to the die paddle;
  b) providing a semiconductor die having a source terminal, a gate terminal, and a drain terminal;
  c) electrically connecting the source terminal to the die paddle and the gate terminal to the at least one of the leads disposed in spaced relation to the die paddle; and
  d) partially encapsulating the die paddle, the leads and the semiconductor die with a layer of encapsulant.

19. The method of claim 18 wherein:
step (a) comprises providing a leadframe wherein the die paddle defines opposed top and bottom surfaces; and
step (c) comprises electrically connecting the source terminal of the semiconductor die to the bottom surface of the die paddle such that the gate terminal is aligned with and exposed in the opening.

20. The method of claim 19 wherein:
step (c) comprises electrically connecting the at least one lead disposed in spaced relation to the die paddle to the gate terminal of the semiconductor die via a conductive wire; and
step (d) comprises encapsulating the conductive wire with the layer of encapsulant.

21. The method of claim 19 wherein step (a) comprises providing a leadframe wherein the die paddle has a generally quadrangular configuration defining at least four peripheral edge segments, and the leads are disposed along a common one of the peripheral edge segments of the die paddle.

22. A method of fabricating a semiconductor package, comprising the steps of:
  a) providing a leadframe which includes at least two leads and a die paddle, one of the leads being disposed in spaced relation to the die paddle, with the remaining one of the leads being attached to the die paddle;
  b) providing at least one semiconductor die having a source terminal, a gate terminal and a drain terminal;
  c) electrically connecting the source terminal to the die paddle and the gate terminal to the at least one of the leads disposed in spaced relation to the die paddle; and
  d) at least partially encapsulating the die paddle, the leads and the semiconductor die with a package body such that at least portions of the leads and the drain terminal of the semiconductor die are exposed in the package body.

* * * * *